(12) United States Patent
Yan et al.

(10) Patent No.: US 9,466,717 B1
(45) Date of Patent: Oct. 11, 2016

(54) COMPLEX SEMICONDUCTOR DEVICES OF THE SOI TYPE

(71) Applicant: GLOBALFOUNDRIES Inc., Grand Cayman (KY)

(72) Inventors: Ran Yan, Dresden (DE); Alban Zaka, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/680,172

(22) Filed: Apr. 7, 2015

(51) Int. Cl.
| | |
|---|---|
| *H01L 29/78* | (2006.01) |
| *H01L 29/66* | (2006.01) |
| *H01L 21/82* | (2006.01) |
| *H01L 29/06* | (2006.01) |
| *H01L 29/08* | (2006.01) |
| *H01L 21/8234* | (2006.01) |
| *H01L 21/8238* | (2006.01) |

(52) U.S. Cl.
CPC ... *H01L 29/7838* (2013.01); *H01L 21/823418* (2013.01); *H01L 21/823814* (2013.01); *H01L 29/0649* (2013.01); *H01L 29/0847* (2013.01); *H01L 29/66636* (2013.01)

(58) Field of Classification Search
CPC .......... H01L 29/0843; H01L 29/0847; H01L 29/6636; H01L 29/7838; H01L 29/41783; H01L 21/823414; H01L 21/823418
See application file for complete search history.

(56) References Cited

U.S. PATENT DOCUMENTS

2009/0224321 A1* 9/2009 Tsuchiya ........... H01L 21/82380
257/351

* cited by examiner

*Primary Examiner* — Thanhha Pham
(74) *Attorney, Agent, or Firm* — Amerson Law Firm, PLLC

(57) ABSTRACT

The present disclosure provides, in a first aspect, a semiconductor device including an SOI substrate portion, a gate structure formed on the SOI substrate portion and source and drain regions having respective source and drain height levels, wherein the source and drain height levels are different. The semiconductor device may be formed by forming a gate structure over an SOI substrate portion, recessing the SOI substrate portion at one side of the gate structure so as to form a trench adjacent to the gate structure and forming source and drain regions at opposing sides of the gate structure, one of the source and drain regions being formed in the trench.

17 Claims, 4 Drawing Sheets

COMPLEX SEMICONDUCTOR DEVICES OF THE SOI TYPE

BACKGROUND OF THE INVENTION

1. Field of the Invention

The present disclosure relates to complex semiconductor devices of the SOI type, and, more particularly, to semiconductor devices of the SOI type with source/drain regions having different height levels, and methods of forming according semiconductor devices.

2. Description of the Related Art

In modern electronic equipment, integrated circuits (ICs) experience a vast applicability in a continuously spreading range of applications. In particular, the demand for increasing mobility of electronic devices at high performance and low energy consumption drives developments to more and more compact devices having features with sizes significantly smaller than 1 µm, the more so as current semiconductor technologies are apt of producing structures with dimensions in the magnitude of 100 nm or less. With ICs representing a set of electronic circuit elements integrated on a semiconductor material, normally silicon, ICs may be made much smaller than any discreet circuit composed of separate independent circuit components. Indeed, the majority of present-day ICs are implemented by using a plurality of circuit elements, such as field effect transistors (FETs), also called metal oxide semiconductor field effect transistors or MOSFETs, occasionally also simply referred to as MOS transistors, and passive elements, such as resistors, e.g., diffusion resistors, and capacitors, integrated on a semiconductor substrate within a given surface area. Typical present-day ICs involve millions of single circuit elements formed on a semiconductor substrate.

The basic function of a MOSFET is that of an electronic switching element, controlling a current through a channel region provided between two junction regions, which are referred to as source and drain. The control of the conductivity state of the channel region is achieved by means of a gate electrode being disposed over the channel region and to which gate electrode a voltage relative to source and drain is applied. In common planar MOSFETs, the channel region extends in a plane between source and drain. Generally, in applying a voltage exceeding a characteristic voltage level to the gate electrode, the conductivity state of the channel is changed and switching between a conducting state or "ON-state" and a non-conducting state or "OFF-state" may be achieved. It is important to note that the characteristic voltage level at which the conductivity state changes (usually called the "threshold voltage") therefore characterizes the switching behavior of the MOSFET and it is generally an issue to keep variations in the threshold voltage level low when implementing a desired switching characteristic. However, with the threshold voltage depending nontrivially on the transistor's properties, e.g., materials, dimensions, etc., the implementation of a desired threshold voltage value during fabrication processes involves careful adjustment and fine tuning during the fabrication processes, which makes the fabrication of complex semiconductor devices by advanced technologies more and more difficult.

The continued miniaturization of semiconductor devices into the deep submicron regime becomes more and more challenging at vary small scales. One of the several manufacturing strategies employed herein is given by SOI technologies. SOI (silicon-on-insulator) refers to the use of a layered silicon-insulator-silicon substrate in place of conventional silicon substrates in semiconductor manufacturing, especially microelectronics, to reduce parasitic device capacitances and short channel effects, thereby improving performance. Semiconductor devices on the basis of SOI differ from conventional semiconductor devices formed on the bulk substrate in that the silicon junction is formed above an electrical insulator, typically silicon dioxide or sapphire (these types of devices are called "silicon-on-sapphire" or "SOS" devices). The choice of insulator depends largely on the intended application, with sapphire usually being employed in high performance radio frequency applications and radiation sensitive applications, and silicon dioxide providing for diminished short channel effects in microelectronic devices.

Basically, two types of SOI devices are distinguished, that is PDSOI (partially depleted SOI) devices and FDSOI (fully depleted SOI) devices. The PDSOI and FDSOI devices differ by the thickness of a silicon layer which is disposed over a buried oxide layer (also referred to as "BOX layer", about 145 nm thick—as an "ultra thin BOX" or "UTBOX", the thickness is in a range from about 10-30 nm), as will be explained with regard to FIG. 1 below. In PDSOI devices, the thickness of the silicon layer is so large that the depletion region formed in the silicon layer does not cover the whole channel region provided in the silicon layer below a gate electrode. Therefore, PDSOI devices behave to a certain extent like bulk semiconductor devices, the more so as the thickness of the silicon layer is increased. The thickness of the silicon layer of conventional PDSOI devices is about 70 nm. FDSOI devices, on the other hand, have a silicon film (conventionally about 5-10 nm thick) formed on the BOX layer or UTBOX layer such that the depletion region in FDSOI devices substantially covers the whole silicon film. Due to the increase in the inversion charges in FDSOI devices, these devices have a higher switching speed. Furthermore, FDSOI devices do not require any doping in the channel region. In general, drawbacks of bulk semiconductor devices, like threshold roll-off, higher sub-threshold slope body effects, short channel effects, etc., are reduced.

A conventional SOI-based semiconductor device 100 is schematically illustrated in FIG. 1. The semiconductor device 100 comprises a gate structure 130 formed over a portion of a semiconductor substrate 110 comprising a silicon film 116, a buried oxide or BOX material 114 and a base silicon 112. The silicon film 116, the BOX material 114 and a portion of the base silicon 112 are surrounded by an insulating structure 120, such as a shallow trench isolation (STI) structure. The insulating structure 120 encompasses an active region of the semiconductor substrate 110 of the SOI type.

From a physical point of view, the silicon film 116 over the BOX material 114 enables the semiconductor material under the gate structure 130, i.e., in the channel region or body of the semiconductor device 100, to be at least partially depleted of charges for PDSOI devices and to be fully depleted of charges in case of FDSOI devices. The net effect is that the gate structure 130 (formed by a gate dielectric 132, a gate electrode 134, a gate contact 136 and sidewall spacers 138) disposed over the semiconductor substrate 110 of the SOI type can now very tightly control the full volume of the body of the semiconductor device 100.

The design process flows and design methodologies to design an FDSOI device, such as the semiconductor device 100, are the same as those normally used in bulk MOS techniques. Basic advantages of FDSOI devices are the lack of a floating body effect or a kink effect associated with PDSOI devices.

However, at very low scales, SOI devices (including FDSOI devices) give rise to very high parasitic capacitances, as will be described below with regard to FIG. 1. Due to the reduced thicknesses of the silicon film 116 in the semiconductor device 100, raised source/drain regions 142 having silicide contacts 144 formed thereon for contacting source/drain contacts 146 are provided, and the raised source/drain regions 142 reduce the resistance of the source/drain contacts in FDSOI devices.

On the other hand, the capacitance of the semiconductor device 100 is increased by the raised source/drain regions 142. Particularly, the raised drain region causes parasitic capacitances between the gate structure 130 and the contact, e.g., a parasitic capacitance $C_1$ (schematically denoting the parasitic gate-contact capacitance), a capacitance $C_2$ (denoting a parasitic capacitance between the gate electrode 134 and the raised drain region, particularly, the raised contact 144), and a parasitic capacitance $C_3$ (originating from a gate overlap). The contribution of the parasitic capacitances $C_1$, $C_2$, $C_3$ to the gate-drain capacitance is at about 61% of the gate capacitance.

From the above description, it is therefore desirable to provide a semiconductor device of SOI type having an improved gate-drain capacitance, while maintaining a low resistance in the contact to source/drain of SOI semiconductor device, particularly with regard to FDSOI devices. It is furthermore desirable to provide for a method of forming an according semiconductor device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a semiconductor device is provided. In some illustrative embodiments herein, the semiconductor device includes an SOI substrate portion, a gate structure formed on the SOI substrate portion, and source and drain regions having respective source and drain height levels, wherein the source and drain height levels are different. In accordance with an explicit example herein, the drain height level may be smaller than the source height level.

In a second aspect of the present disclosure, a semiconductor device is provided. In accordance with some illustrative embodiments herein, the semiconductor device includes an FDSOI substrate portion comprising a thin semiconductor film disposed on an ultra-thin buried insulating material formed on the base substrate, a gate structure formed on the FDSOI substrate portion, and source and drain regions formed at opposing sides of the gate structure, the source and drain regions having respective source and drain height levels, wherein the drain region and the base substrate are in direct contact and the source region is formed on the semiconductor film.

In a third aspect of the present disclosure, a method of forming a semiconductor device is provided. In accordance with illustrative embodiments herein, the method includes forming a gate structure over an SOI substrate portion, recessing the SOI substrate portion at one side of the gate structure so as to form a trench adjacent to the gate structure, and forming source and drain regions at opposing sides of the gate structure, one of the source and drain regions being formed in the trench.

BRIEF DESCRIPTION OF THE DRAWINGS

The disclosure may be understood by reference to the following description taken in conjunction with the accompanying drawings, in which like reference numerals identify like elements, and in which.

Figure 1:
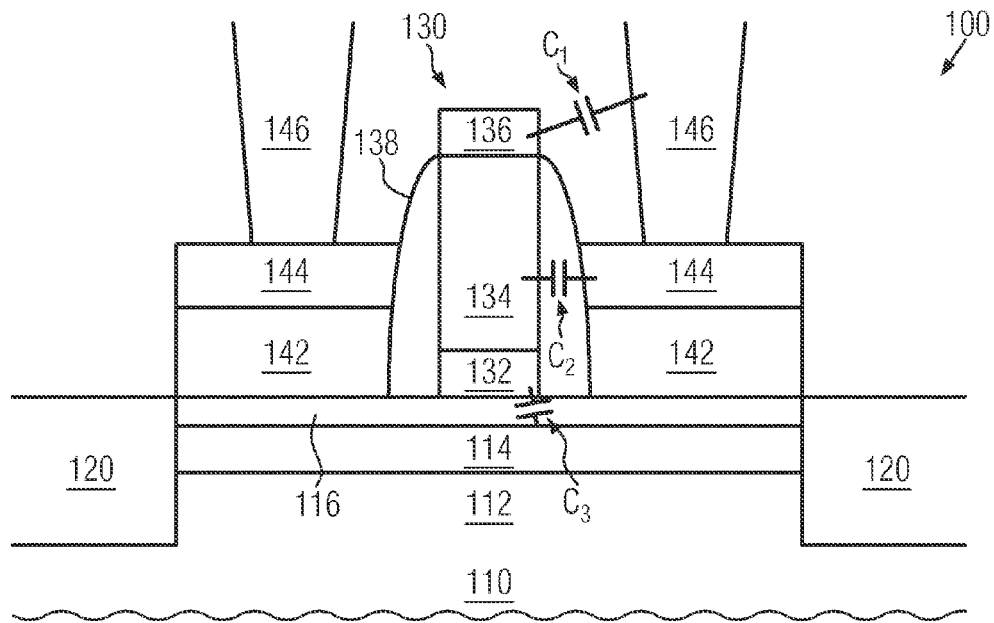
FIG. 1 schematically illustrates a conventional FDSOI device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will, of course, be appreciated that, in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and to semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which are fabricated by using advanced technologies, i.e., the semiconductor devices are fabricated by technologies applied to approach technology nodes smaller than 100 nm, for example, smaller than 50 nm or smaller than 35 nm. The person skilled in the art will appreciate that, according to the present disclosure, ground rules smaller or equal to 45 nm may be imposed. The person skilled in the art will appreciate that the present disclosure proposes semiconductor devices with structures of minimal length dimensions and/or width dimensions smaller than 100 nm, for example, smaller than 50 nm or smaller than 35 nm. For example, the present disclosure may provide semiconductor devices fabricated by using 45 nm technologies or below, e.g., 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

Figure 2A:
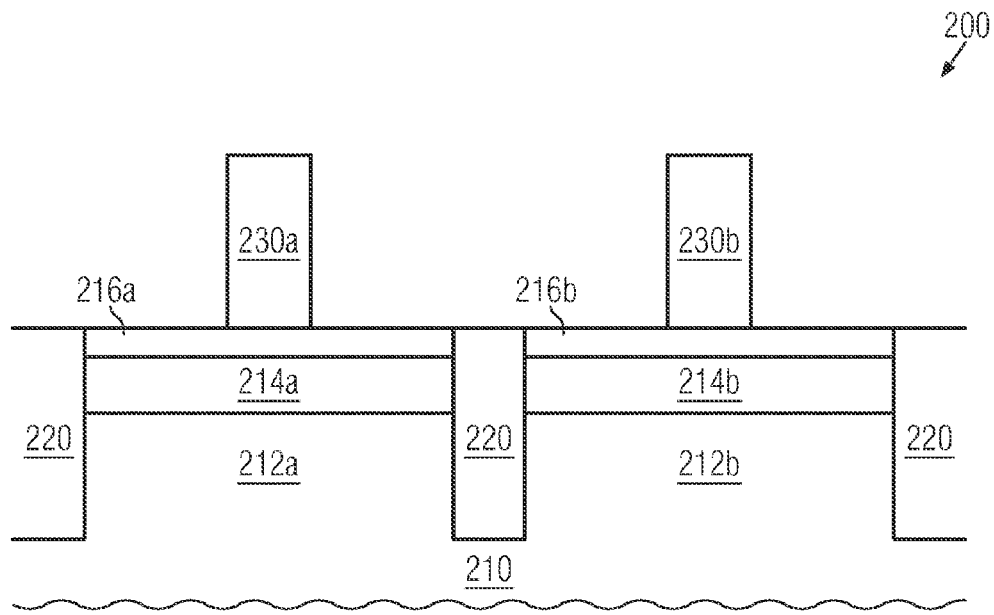
FIG. 2a-2f schematically illustrate in cross-sectional views a method of forming a semiconductor device in accordance with some illustrative embodiments of the present disclosure.

FIG. 2a schematically illustrates, in a cross-sectional view, a semiconductor device structure 200 formed in and over a semiconductor substrate 210. The semiconductor substrate 210 may be a base semiconductor substrate of an SOI substrate. The SOI structure may be partitioned into SOI portions separated by insulating structures 220, such as shallow trench isolation (STI) structures. Over a first SOI portion, a semiconductor device 230a may be formed, while over a second SOI portion, a gate structure 230b is formed. The first SOI portion comprises a semiconductor film 216a, a buried insulating material 214a and a base semiconductor portion 212a. The second SOI portion comprises a semiconductor film 216b, a buried insulating material layer 214b and a base semiconductor portion 212b. In accordance with some illustrative embodiments herein, the semiconductor film 216a, 216b may be provided by a semiconductor material, e.g., silicon or silicon germanium. In accordance with some examples, the semiconductor film 216a, 216b may have a thickness in a range from about 5-10 nm. In accordance with some illustrative embodiments of the present disclosure, the buried insulating material 214a, 214b may be a silicon oxide material and may have a thickness in a range from about 10-30 nm, alternatively the thickness may be in a range from 130-160 nm, e.g., about 145 nm. In accordance with some illustrative embodiments, the base semiconductor portion 212a, 212b may be formed by silicon or any other appropriate semiconductor material.

The person skilled in the art will appreciate that, although the gate structures 230a, 230b are only depicted in a very schematic way, no limitation of the present disclosure is intended. For example, the gate structures 230a, 230b may comprise one or more gate dielectric material layers, e.g., one or more high-k material layers, a work function adjusting material, a gate electrode and an optional gate cap in accordance with gate first techniques. Alternatively, the gate structures 230a, 230b may represent dummy gate structures as known in replacement gate techniques or gate last techniques. Furthermore, each of the gate structures 230a, 230b may have a sidewall spacer structure (not illustrated) covering sidewalls of the gate electrodes.

Figure 2B:
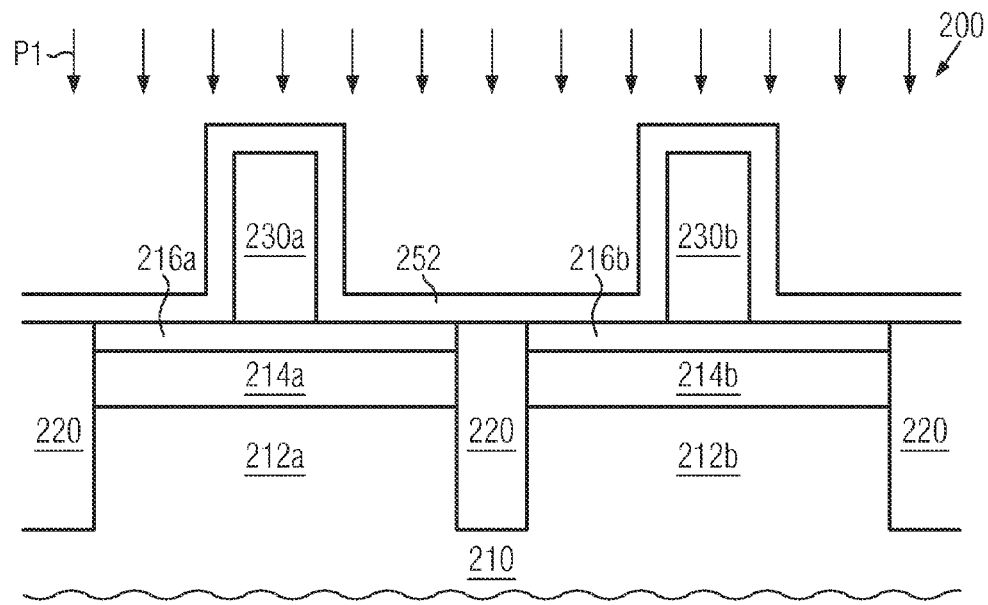

Referring to FIG. 2b, the semiconductor device structure 200 is schematically illustrated at a more advanced stage during fabrication, particularly after an insulating material layer 252 is deposited over the semiconductor device structure 200 and before a process P1 is performed.

In accordance with some illustrative embodiments of the present disclosure, the insulating material layer 252 may be formed by silicon nitride. For example, the insulating material layer 252 may be formed in accordance with techniques employed for forming a hard mask.

In accordance with some illustrative embodiments of the present disclosure, the process P1 may comprise a patterning process for patterning the layer of insulating material 252 such that a mask pattern 254 (FIG. 2c) is formed over the semiconductor device structure 200. In accordance with some illustrative examples herein, the process P1 may comprise a process sequence for depositing a photoresist (not illustrated) over the semiconductor device structure 200 and patterning the photoresist (not illustrated) by employing lithography techniques. After having patterned the photoresist (not illustrated), the lithographically patterned photoresist (not illustrated) may be transferred into the insulating material layer 252, e.g., by performing an anisotropic etching so as to form the masking pattern 254 illustrated in FIG. 2c. In a subsequent step (not illustrated), the photoresist (not illustrated) is removed from above the semiconductor device structure 200 and the process P1 may be completed.

Figure 2C:
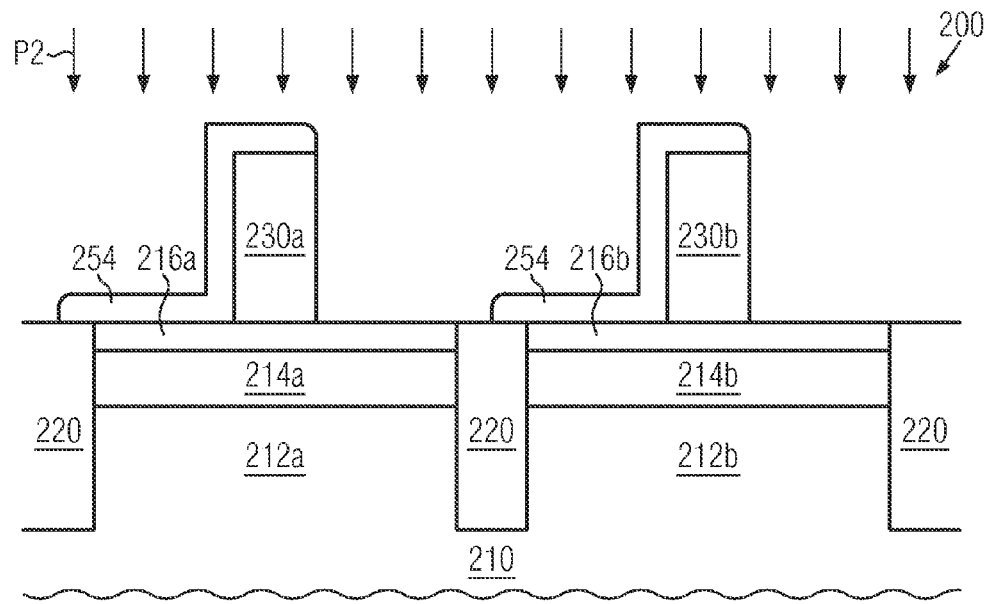

Referring to FIG. 2c, the semiconductor device structure 200 is schematically illustrated at a more advanced stage during fabrication, particularly after the process P1 is completed and before a process P2 is performed.

In accordance with some illustrative embodiments of the present disclosure, the process P2 may comprise an anisotropic etch sequence, e.g. a dry etch sequence, for etching the semiconductor device structure 200 in accordance with the masking pattern 254. As a result of the process P2, trenches 240a, 240b (FIG. 2d) are formed at one side of each of the gate structures 230a, 230b. For example, the process P2 may comprise a reactive ion etch (RIE) sequence. In accordance with an illustrative example, the process P2 may comprise at least one etch sequence with end point control. In accordance with a first example, the process P2 comprises a first sequence with end point control to completely remove a portion of the semiconductor film 216a below the gate structure 230a, leaving portion 217a (FIG. 2d), and to completely remove a portion of the semiconductor film 216b below the gate structure 230b, leaving portion 217b (FIG. 2d), in accordance with the masking pattern 254. In a second example, the process P2 may comprise a first and a second sequence, the first sequence partially removing the semiconductor films 216a, 216b and the second sequence partially removing the buried insulating materials 214a, 214b, leaving remaining insulating materials 215a, 215b, to expose upper surface regions 212ua, 212ub (see FIG. 2d) of the base semiconductor portions 212a, 212b. This does not pose any limitation to the present disclosure and the person skilled in the art will appreciate that, in general, a trench 240a with varying depth may be formed, for example, even extending deep into the base semiconductor portions 212a, 212b.

Figure 2D:
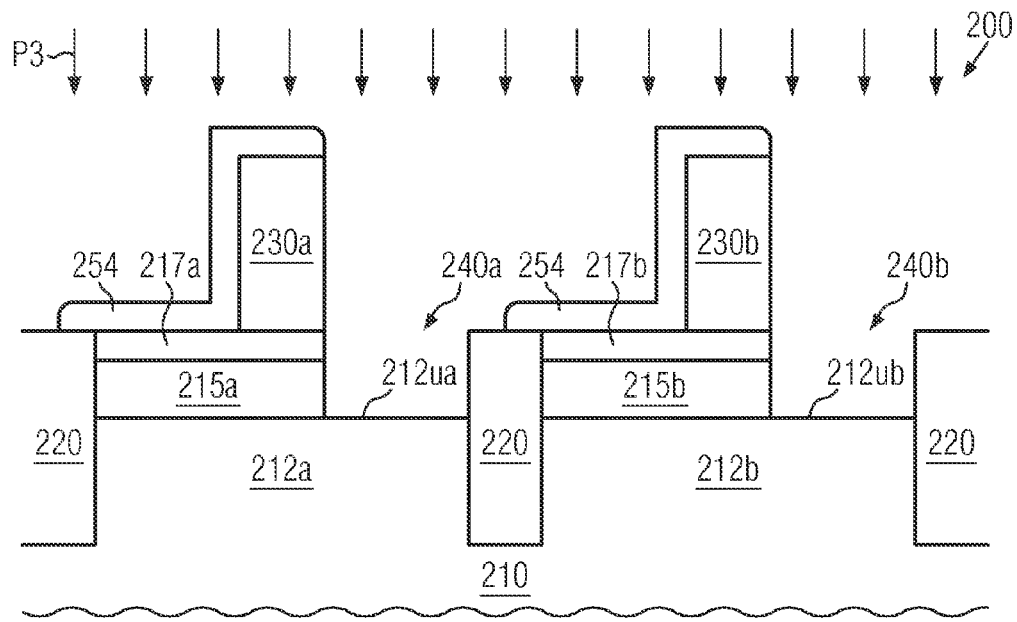

Referring to FIG. 2d, the semiconductor device structure 200 is schematically illustrated at a more advanced stage during fabrication, particularly after the process P2 is completed and before a process P3 is performed, the process P3 removing the masking pattern 254 over the semiconductor device structure 200.

Figure 2E:
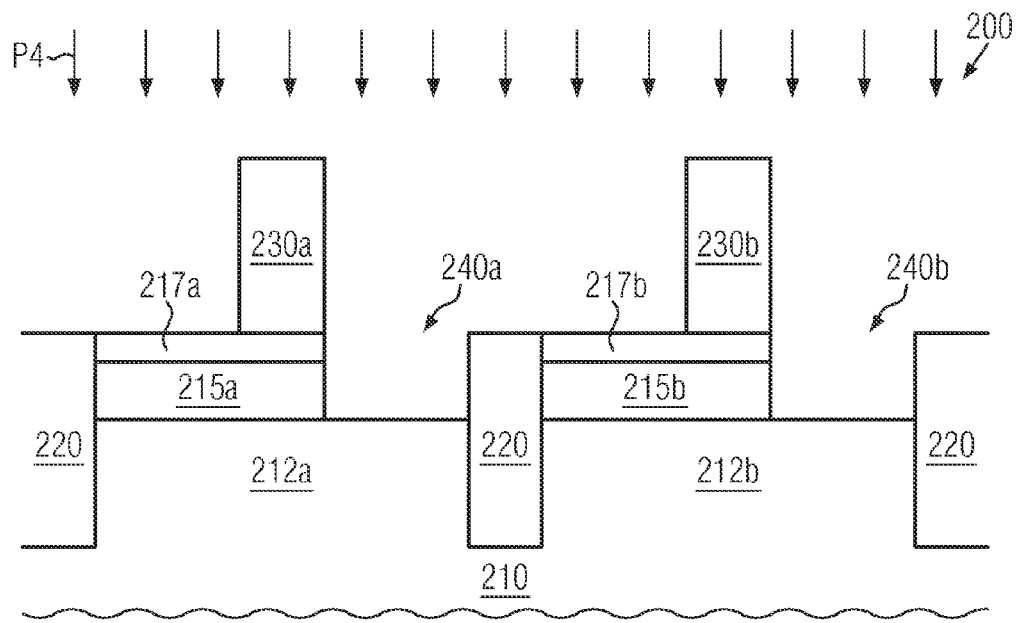

Referring to FIG. 2e, the semiconductor device structure 200 is schematically illustrated at a more advanced stage during fabrication, particularly after the process P3 is completed and before a process P4 is performed. In accordance with some illustrative embodiments of the present disclosure, the process P4 may comprise an epitaxial growth process for growing epitaxially grown material, also referred to as epi material, at both sides of each gate structure 230a, 230b to fill each of the trenches 240a, 240b with epi material and growing epi material on an upper surface of the semiconductor film 217a at the opposing side of the gate structure 230a. In accordance with some illustrative embodiments of the present disclosure, the epi material grown in the process P4 may be doped with dopants for forming source/drain regions. In accordance with some illustrative examples herein, the epi material may comprise SiGe material or SiC material.

Figure 2F:
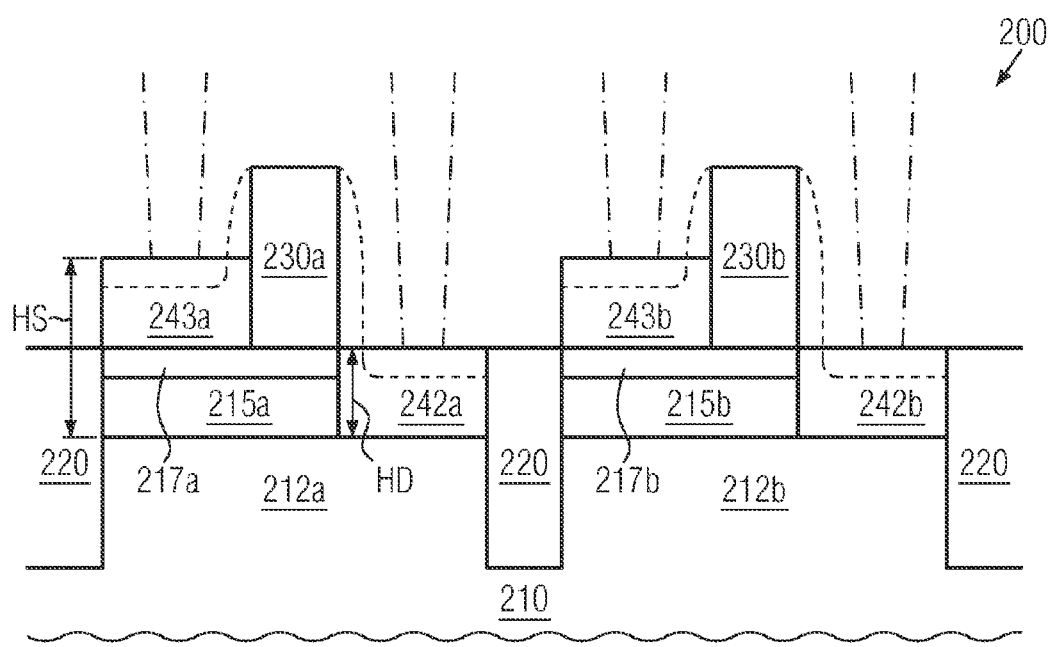

Referring to FIG. 2f, the semiconductor device structure 200 is schematically illustrated at a more advanced stage during fabrication, particularly after the process P4 is completed. As a result of the process P4, raised source regions 243a, 243b and drain regions 242a, 242b are formed at opposing sides of the gate structures 230a, 230b. The raised source region 243a has a height level HS with regard to a reference level, for example, an upper surface of the base semiconductor portion 212a or a bottom of the trench 240a as illustrated in FIG. 2f. The drain region 242a has a height level HD with regard to a reference level, e.g. a bottom of the trench 240a in FIG. 2e. The person skilled in the art will appreciate the height level HD and the height level HS are determined relative to a common reference. The height levels of the raised source region 243b and the raised drain region 242b may be accordingly defined.

With regard to the height level of the raised source regions, the person skilled in the art will appreciate that the height level of the raised source region 243a is substantially different from the height level HD of the drain region 242a, while a thickness of epitaxially grown material is for both regions the same. The raised source region 243b and the raised drain region 242b are accordingly formed.

In this way, a contribution of a gate-drain capacitance is reduced. However, the person skilled in the art will appreciate that the embodiment as illustrated in FIG. 2f does not limit the scope of the present disclosure and the drain region 242a may be formed by overfilling the trench 240a such that a slightly raised drain region (not illustrated) may be formed instead. The person skilled in the art will appreciate that, in having different height levels for the source and drain regions, the contribution of the drain region may be reduced when the height level of the drain region is substantially smaller than the height level of the source region. Subsequently, silicide regions (not illustrated) and contacts may be formed in accordance with known techniques.

In case of an upper surface of the drain region and an upper surface of the semiconductor film 217a being even, as it is illustrated in FIG. 2f, processing may continue instead by forming additional sidewall spacers (indicated by a dotted line in FIG. 2f) to the gate structures 230a, 230b for further adjusting a distance to silicide regions which are to be formed in the drain regions 242a, 242b (see dotted line in the drain region 242a, 242b) relative to the gate structures 230a, 230b and therefore to channel regions below the gate structure 230a, 230b. However, this does not pose any limitation to the present disclosure, and the person skilled in the art will appreciate that in cases in which the drain region overfills the trenches 240a, 240b, the additional sidewall spacers indicated by dotted lines in FIG. 2f may be also omitted.

Subsequent to the formation of the raised source 243a, 243b and the drain region 242a, 242b, source/drain contacts (indicated by a dotted broken line in FIG. 2f) may be formed.

In accordance with some illustrative embodiments of the present disclosure, it is proposed to etch into the SOI substrate at one side of a gate structure, particularly at a drain side, in order to avoid raising the drain region up to the same height level as the source region. In this way, the contribution of a parasitic capacitance between the gate and the drain region may be significantly reduced, while the benefits of SOI structures, like back bias and the absence of source to drain leakage, are maintained. Particularly in FDSOI techniques, a fully depleted general region is maintained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:

forming a gate structure over an SOI substrate, said SOI substrate comprising a base semiconductor material, a buried insulation material positioned above said base semiconductor material and a semiconductor film positioned above said buried insulation layer, said gate structure having first and second opposing sides;

performing at least one process operation to remove a portion of said semiconductor film and to remove a portion of said buried insulation layer located proximate said first opposing side of said gate structure so as to form a trench proximate said first opposing side without removing a portion of said semiconductor film or a portion of said buried insulation layer on said second opposing side;

forming a first source and drain region in said trench on said first opposing side; and forming a second source and drain region on said semiconductor film on said second opposing side.

2. The method of claim 1, further comprising forming a patterned masking layer above said SOI substrate before performing said at least one process operation, wherein said patterned masking layer exposes said semiconductor film on said first opposing side and covers said semiconductor film on said second opposing side.

3. The method of claim 2, wherein forming said patterned masking layer comprises depositing a layer comprising silicon nitride over said SOI substrate and removing said layer comprising silicon nitride proximate said first opposing side of said gate structure.

4. The method of claim 1, wherein performing said at least one process operation comprises performing at least one dry etch process.

5. The method of claim 1, wherein, in performing said at least one process operation, said base semiconductor material is exposed at a bottom of said trench.

6. The method of claim 1, wherein forming said source and drain regions comprises epitaxially growing source/drain semiconductor material for forming said source and drain regions.

7. The method of claim 6, wherein said source and drain regions are simultaneously grown.

8. The method of claim 6, wherein said trench is completely filled by said source/drain semiconductor material such that an upper surface of said source/drain semiconductor material in said trench and an upper surface of said semiconductor film positioned below said gate structure are substantially coplanar.

9. The method of claim 1, wherein said source region is formed in said trench.

10. The method of claim 1, wherein said drain region is formed in said trench.

11. The method of claim 1, wherein said first source and drain region has a first top surface with a first height lower than a second height of a second top surface of said second source and drain region.

12. A method of forming a semiconductor device, the method comprising:
forming a gate structure over an SOI substrate, said SOI substrate comprising a base semiconductor material, a buried insulation material positioned above said base semiconductor material and a semiconductor film positioned above said buried insulation layer, said gate structure having first and second opposing sides;
performing at least one etching process operation to remove a portion of said semiconductor film and to remove a portion of said buried insulation layer located proximate said first opposing side so as to form a trench proximate said first opposing side without removing a portion of said semiconductor film or a portion of said buried insulation layer on said second opposing side, said trench exposing said base semiconductor material; and
performing a common epitaxial growth process to form a drain region in said trench and to form a source region on said semiconductor film proximate said second opposing side.

13. The method of claim 12, further comprising forming a patterned masking layer above said SOI substrate before performing said at least one process operation, wherein said patterned masking layer exposes said semiconductor film on said first opposing side and covers said semiconductor film on said second opposing side.

14. The method of claim 12, wherein forming said patterned masking layer comprises depositing a layer comprising silicon nitride over said SOI substrate and removing said layer comprising silicon nitride proximate said first opposing side of said gate structure.

15. The method of claim 12, wherein performing said at least one etching process operation comprises performing at least one dry etch process.

16. The method of claim 12, wherein performing said common epitaxial growth process comprises performing said common epitaxial growth process such that said drain region has an upper surface that is substantially coplanar with an upper surface of said semiconductor film positioned below said gate structure.

17. The method of claim 12, wherein said source region has a first top surface with a first height greater than a second height of said drain region.

* * * * *